(12) United States Patent
Nakano

(10) Patent No.: US 7,151,310 B2
(45) Date of Patent: Dec. 19, 2006

(54) PACKAGE SUBSTRATE, INTEGRATED CIRCUIT APPARATUS, SUBSTRATE UNIT, SURFACE ACOUSTIC WAVE APPARATUS, AND CIRCUIT DEVICE

(75) Inventor: Masahiro Nakano, Tokyo (JP)

(73) Assignee: TDK Corporation, Tokyo (JP)

( * ) Notice: Subject to any disclaimer, the term of this patent is extended or adjusted under 35 U.S.C. 154(b) by 13 days.

(21) Appl. No.: 10/253,991

(22) Filed: Sep. 25, 2002

(65) Prior Publication Data

US 2003/0058064 A1    Mar. 27, 2003

(30) Foreign Application Priority Data

Sep. 25, 2001 (JP) ............... 2001-292611
Sep. 25, 2001 (JP) ............... 2001-292612
Sep. 28, 2001 (JP) ............... 2001-301853

(51) Int. Cl.
*H01L 23/053* (2006.01)
*H01L 23/12* (2006.01)
*H01L 41/00* (2006.01)
*H03H 9/00* (2006.01)

(52) U.S. Cl. ............... 257/700; 257/700; 257/678; 257/778; 333/133; 333/193

(58) Field of Classification Search ............ 257/686, 257/689–693, 700, 703, 704, 723, 728, 778, 257/774–776, E21.597, 678; 333/133, 193, 333/195

See application file for complete search history.

(56) References Cited

U.S. PATENT DOCUMENTS

| | | | |
|---|---|---|---|
| 4,352,449 A | 10/1982 | Hall et al. | |
| 4,551,746 A | 11/1985 | Gilbert et al. | |
| 4,737,742 A | 4/1988 | Takoshima et al. | |
| 4,790,894 A | 12/1988 | Homma et al. | |
| 5,058,265 A | 10/1991 | Goldfarb | |
| 5,459,368 A * | 10/1995 | Onishi et al. | 310/313 R |
| 5,561,406 A * | 10/1996 | Ikata et al. | 333/126 |
| 5,691,568 A | 11/1997 | Chou et al. | |
| 5,786,738 A * | 7/1998 | Ikata et al. | 333/133 |
| 5,859,473 A * | 1/1999 | Ikata et al. | 257/723 |
| 6,057,600 A * | 5/2000 | Kitazawa et al. | 257/728 |

(Continued)

FOREIGN PATENT DOCUMENTS

| | | |
|---|---|---|
| EP | 0 617 466 A2 | 9/1994 |
| EP | 1 050 906 A1 | 11/2000 |
| EP | 1 076 414 A2 | 2/2001 |
| JP | 11-26623 | 1/1999 |
| JP | 2000049565 A * | 2/2000 |

OTHER PUBLICATIONS

European Search Report dated Apr. 17, 2003.
European Search Report dated Jan. 29, 2003.

*Primary Examiner*—Kenneth Parker
*Assistant Examiner*—Chris C. Chu
(74) *Attorney, Agent, or Firm*—McGinn IP Law Group, PLLC

(57) ABSTRACT

On a piezoelectric substrate 23, there are provided surface acoustic wave devices $F_1$ and $F_2$ in which predetermined circuit patterns are formed, and a package substrate 11 comprising side vias 16 formed in a caved manner in the thickness direction on side surfaces on which the surface acoustic wave devices are mounted. When the side vias 16 are each assumed to have the opening width $\phi$ and the maximum depth D, a size satisfying $\phi/2<D$ is assumed. Thereby, it is possible to prevent protrusion of a soldering fillet applied on the side via.

17 Claims, 17 Drawing Sheets

U.S. PATENT DOCUMENTS 6,245,186 B1 * 6/2001 Alcoe et al. ................. 156/300
6,351,194 B1 * 2/2002 Takahashi et al. .......... 333/133
6,356,173 B1 * 3/2002 Nagata et al. .............. 333/247
6,388,545 B1 * 5/2002 Kawachi et al. ............ 333/193
6,534,855 B1 * 3/2003 Ahn et al. .................. 257/698
6,570,469 B1 * 5/2003 Yamada et al. ............. 333/193

* cited by examiner

PACKAGE SUBSTRATE, INTEGRATED CIRCUIT APPARATUS, SUBSTRATE UNIT, SURFACE ACOUSTIC WAVE APPARATUS, AND CIRCUIT DEVICE

BACKGROUND OF THE INVENTION

The present invention relates to a package substrate, integrated circuit apparatus, substrate unit, surface acoustic wave apparatus, and circuit device, particularly to a surface acoustic wave device.

Today, mobile communication devices represented by portable phones which have been remarkably spread are being rapidly making smaller in size. Along with this, reduction in size and high performance are requested for parts used in the mobile communication devices. Here, frequency dividers are used for conducting branching and generating of signals in the mobile communication devices. Some frequency dividers are configured with a bandpass filter, band rejection filter, or a combination thereof, but other frequency dividers employ a surface acoustic wave apparatus on which two surface acoustic wave devices having mutually different bandpass center frequencies are mounted in order to achieve more reduction in size and higher performance.

Mounting substrates on which such a surface acoustic wave apparatus is mounted have been also made smaller in size and weight. Therefore, it is required that the surface acoustic wave apparatus is mounted on the mounting substrate in a high density manner. In some package substrates of the surface acoustic wave apparatuses, side vias are formed in a caved manner in the thickness direction inside surfaces. When such a surface acoustic wave apparatus is soldered on the mounting substrate, a soldering fillet applied on the side via is protruded so that the mounting area is increased, thereby the aforementioned request of the high density mounting cannot be achieved. Such a problem is not only true to the surface acoustic wave apparatuses, but also to general integrated circuit apparatuses on which integrated circuit devices are mounted on the package substrate.

Further, when the frequency divider is configured with two surface acoustic wave devices having mutually different bandpass center frequencies, in order that the mutual filter characteristics are not interfered, phase adjusting circuits are provided in the respective devices. The phase adjusting circuits are within the package with a multilayer structure made of ceramics (for example, alumina ceramics or glass ceramics) together with the surface acoustic wave devices to configure the package of the frequency divider which is the surface acoustic wave apparatus.

Here, a section view of the package of the frequency divider with the multilayer structure is shown in FIG. 17. In the illustrated package 100 of the frequency divider, a device mounting layer 101 on which two surface acoustic wave devices $F_1$ and $F_2$ having mutually different bandpass center frequencies are mounted is provided as the uppermost layer, a ground layer 102 in which ground electrodes are formed, a circuit forming layer 103 in which high frequency circuits such as phase adjusting circuits are formed, and the lowermost layer which is a substrate connecting layer 104 in which common ground electrodes or external connecting terminals are formed are positioned toward the lower layers from the uppermost layer, and the surface acoustic wave devices $F_1$ and $F_2$ are airtightly sealed by a cap 106. Interlayers are appropriately connected by via holes 108 in an electric manner.

Here, in the frequency divider, various elements such as specifications of high frequency circuits or wiring lengths are determined so as to have specific electric frequency characteristics. In order to obtain initial frequency characteristics, there is configured such that only the lowermost layer or uppermost layer is penetrated, and the portions in which wirings are not led there from, that is open stubs are not generated. For the purpose of that, the aforementioned ceramics capable of electrically connecting only the required interlayers are used as substrate materials, or the number of laminates is increased in order to avoid the open stubs so that wirings are connected.

However, when the number of laminates is increased in order to avoid the open stubs, the package of the frequency divider is increased in size and cost thereof is also increased. Such a problem is not only true to the package of the frequency divider, but also to general surface acoustic wave apparatuses.

Further, in order to obtain larger output, reflectors are provided in resonators which are one of components of the surface acoustic wave device. In the package of the frequency divider to which such surface acoustic wave devices are used, temperature of the devices becomes high during operating so that large heat resistance is generated. As a result, there is generated a case where initial operating characteristics cannot be obtained so that stability of the operation is lost. Here, it is considered that radiating fins are provided in the package of the frequency divider, but the package is increased in size so that the request in the market cannot be achieved. Such a problem is not only true to the package of the frequency divider, but also to general surface acoustic wave apparatuses.

SUMMARY OF THE INVENTION

It is an object of the present invention to provide a technique capable of preventing protrusion of a soldering fillet applied on a side via.

Further, it is another object of the present invention to provide a thin surface acoustic wave apparatus having predetermined electric frequency characteristics.

Further, it is another object of the present invention to provide a surface acoustic wave apparatus capable of efficiently conducting radiating of surface acoustic wave devices without increasing a package in size.

In order to solve the above objects, an integrated circuit apparatus according to the present invention is configured by comprising integrated circuit devices in which predetermined circuit patterns are formed on a device substrate, and a package substrate comprising side vias formed in a caved manner in the thickness direction on side surfaces on which the integrated circuit devices are mounted, wherein, when the side vias are each assumed to have the opening width $\phi$ and the maximum depth D, $\phi/2<D$ is assumed. According to such an invention, a soldering fillet applied on the side via is within the side via so that it is possible to prevent protrusion of the soldering fillet applied on the side via.

Further, in order to solve the above objects, a substrate unit according to the present invention is configured by comprising an integrated circuit apparatus having integrated circuit devices in which predetermined circuit patterns are formed on a device substrate, and a package substrate comprising side vias formed in a caved manner in the thickness direction on side surfaces on which the integrated circuit devices are mounted, and a mounting substrate in which all electrodes electrically connected to the integrated circuit apparatus are formed on the inside of a device mounting area which is a mounting area of the integrated circuit apparatus and the integrated circuit apparatus is mounted on the device mounting area. According to such an invention, the electrode portions are arranged on the inside of the device mounting area so that it is possible to prevent protrusion of the soldering fillet applied on the side via.

In order to solve the above objects, a surface acoustic wave apparatus according to the present invention is configured by comprising a device mounting layer made of resin in which surface acoustic wave devices having a predetermined bandpass center frequency are mounted on a device mounting surface, a substrate connecting layer made of resin in which external connecting terminals electrically connected to a mounting substrate are formed on a terminal forming surface facing in the opposite direction to the device mounting surface, at least one function layer made of resin which is provided between the device mounting layer and the substrate connecting layer and in which predetermined circuit patterns and wirings are formed, and at least one throughhole which is formed from the device mounting layer through the function layer to the substrate connecting layer in a penetrating manner and electrically connects other portions than the portion between the device mounting surface side and the terminal forming surface side to have open stubs. According to such an invention, since there is configured such that predetermined electric frequency characteristics can be obtained in consideration of the open stubs, it is possible to prevent that the number of laminates is increased in order to avoid the open stubs and the package is increased in size. Therefore it is possible to obtain a thin surface acoustic wave apparatus having predetermined electric frequency characteristics.

In order to solve the above objects, a surface acoustic wave apparatus according to the present invention is configured by comprising surface acoustic wave devices having a predetermined bandpass center frequency and a package substrate in which the surface acoustic wave devices are mounted in a flip-chip mounting manner, wherein the surface acoustic wave devices each comprise resonators for resonating with surface acoustic waves of a predetermined frequency, first electrodes which electrically connect the resonators and the package substrate and are concerned with electric operation of the resonators, and second electrodes which are electrically b connected to wirings other than the input/output electrodes formed on the package substrate and are not concerned with electric operation of the resonators. According to such an invention, since heat generated during operating of the surface acoustic wave devices is propagated through the second electrodes to the wirings of the package substrate so that radiating is conducted, it is possible to efficiently conduct radiating of the surface acoustic wave devices without increasing the package in size.

DETAILED DESCRIPTION OF THE PREFERRED EMBODIMENTS

Hereinafter, embodiments according to the present invention will be described in further detail with reference to the drawings. Here, in the accompanying drawings, like numerals are denoted to like parts, and repeated explanation is omitted. Additionally, the embodiments according to the invention are embodiments particularly useful for carrying out the present invention, and the present invention is not limited to the embodiments.

Figure 1:
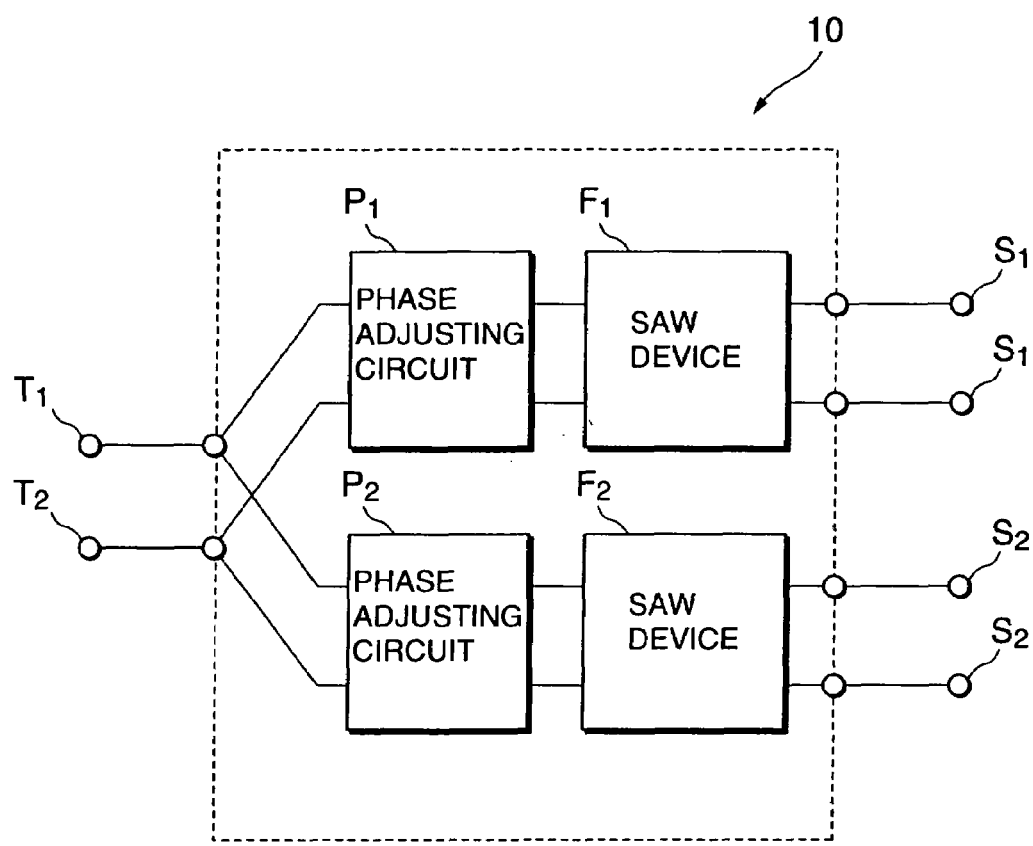
FIG. 1 is a block diagram showing a configuration of a frequency divider according to a first embodiment of the present invention.
Figure 2:
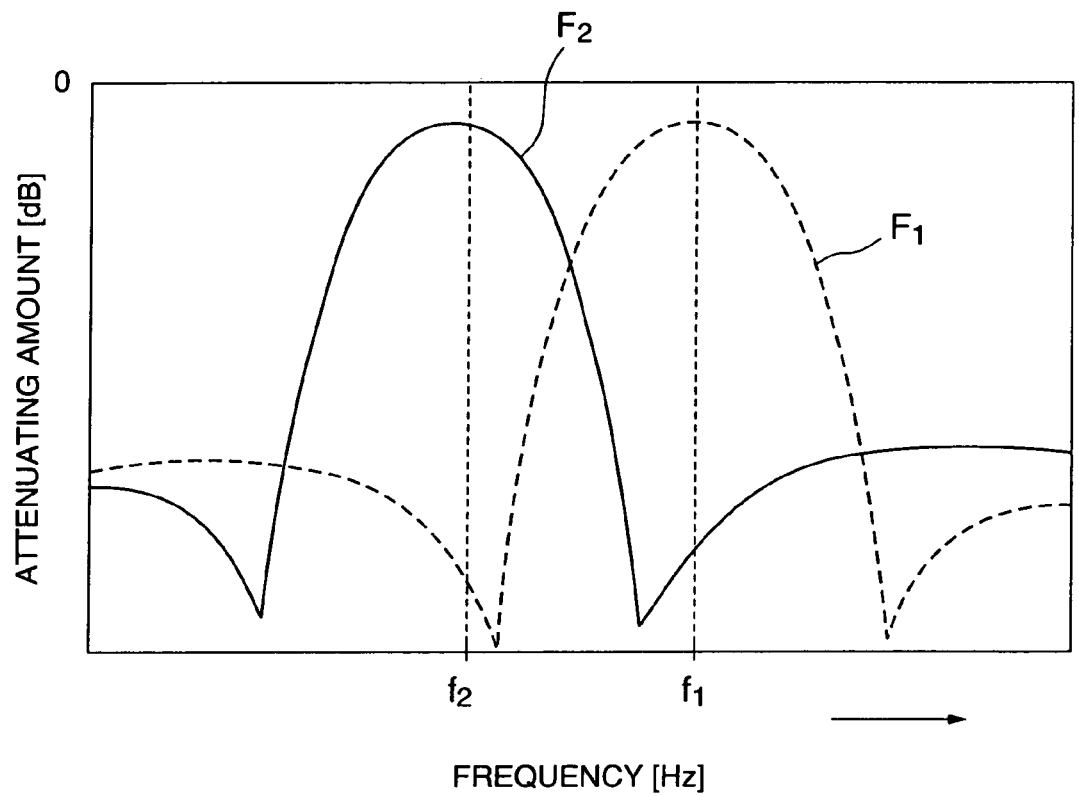
FIG. 2 is a characteristic diagram showing the frequency divider in FIG. 1.
Figure 3:
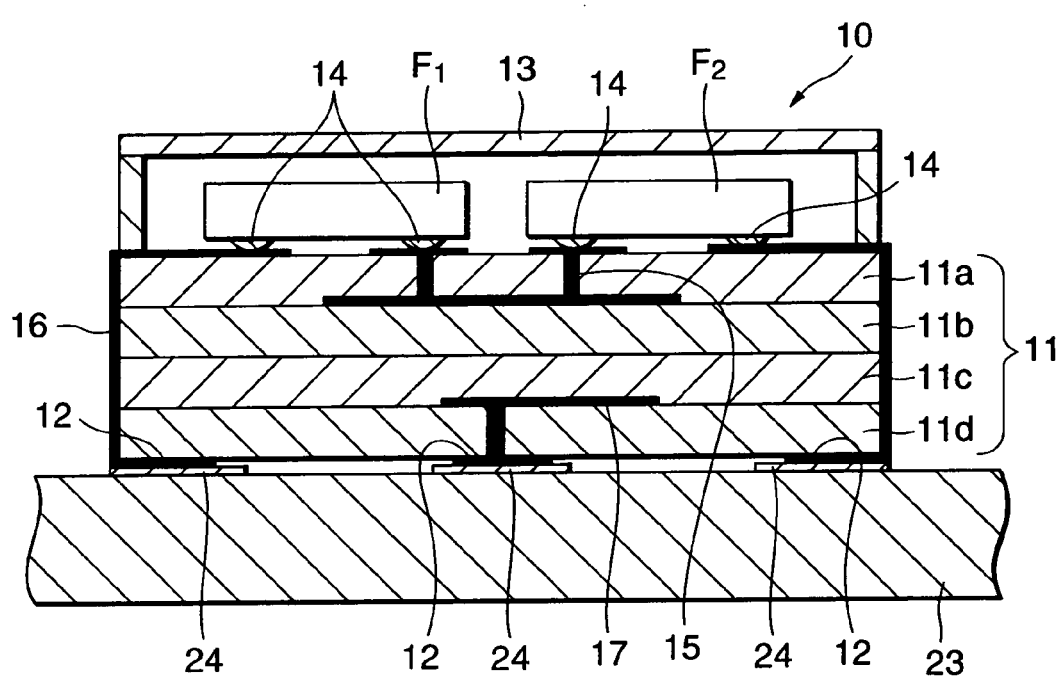
FIG. 3 is a section view showing a package of the frequency divider in FIG. 1.
Figure 4:
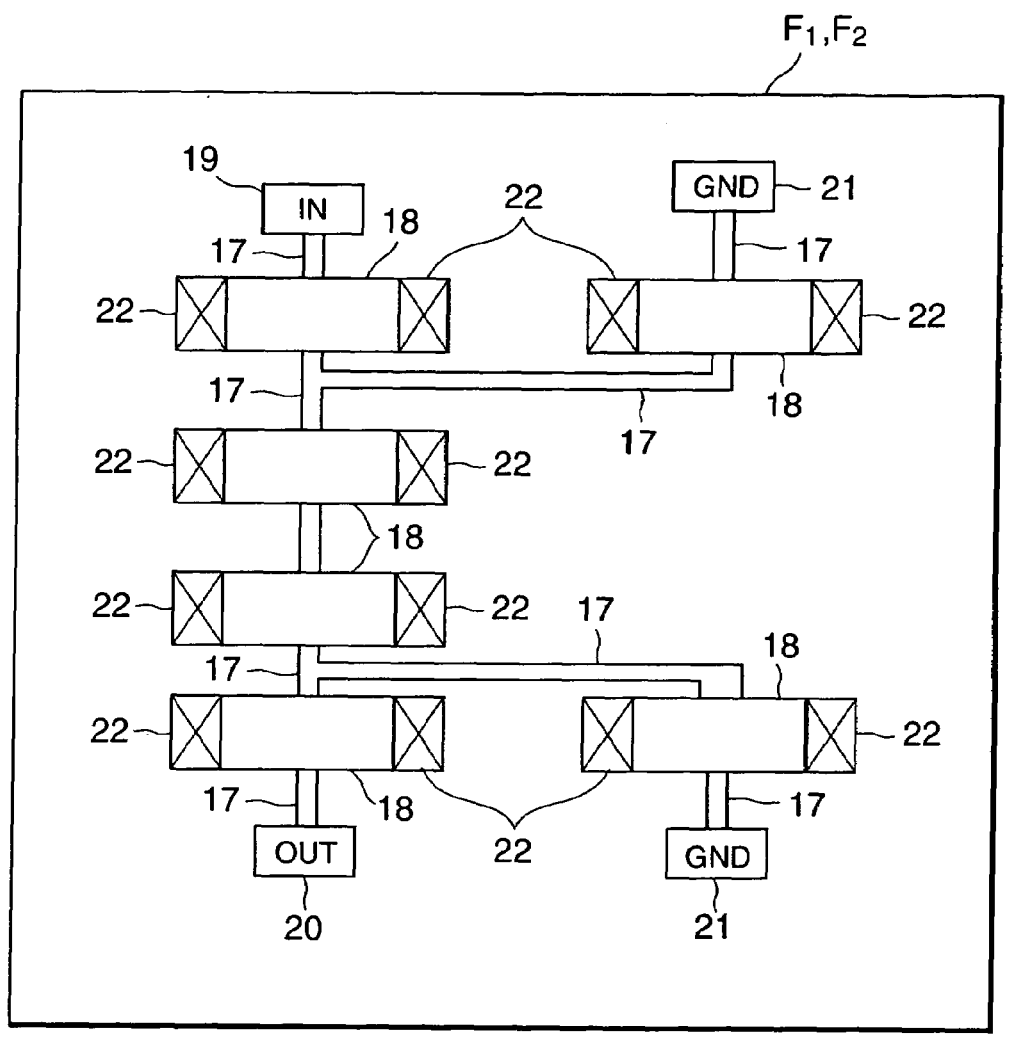
FIG. 4 is a schematic diagram showing a circuit of a surface acoustic wave device which is a component of the frequency divider in FIG. 1.
Figure 5:
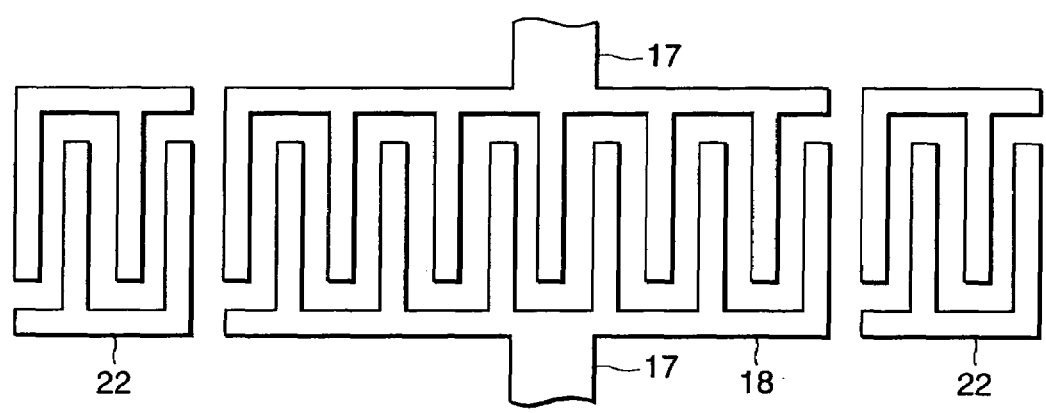
FIG. 5 is a plan view showing a circuit layout on the periphery of resonators in the surface acoustic wave device in FIG. 4.
Figure 6:
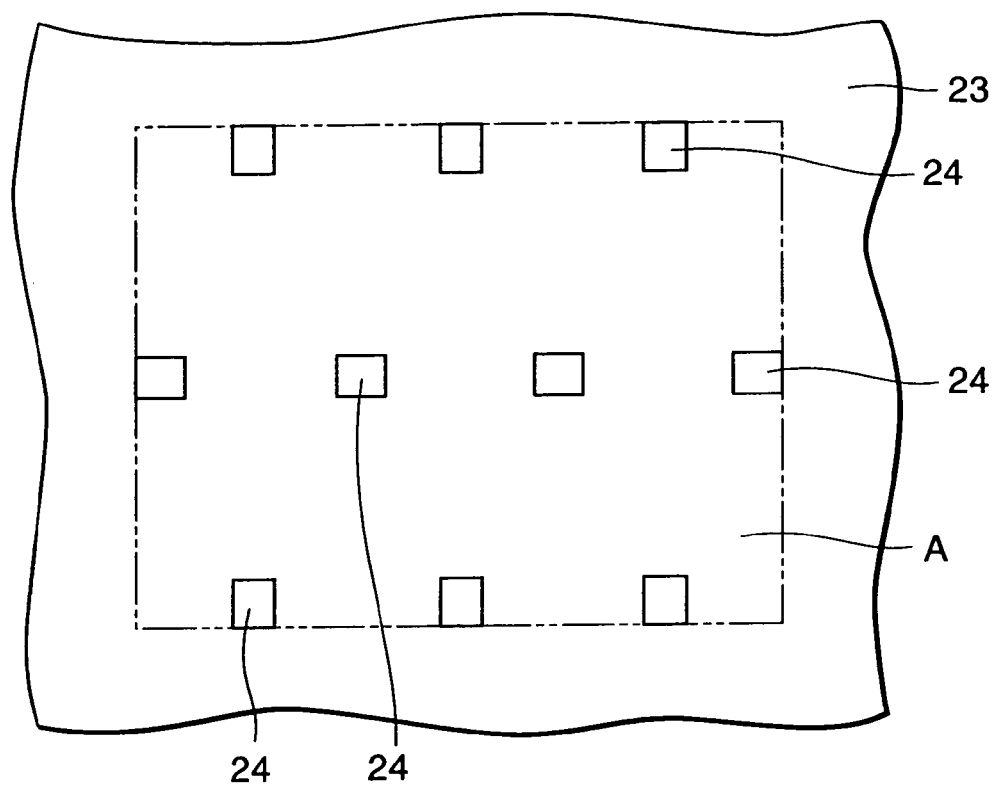
FIG. 6 is a plan view showing part of a mounting substrate on which the frequency divider in FIG. 1 is mounted.
Figure 7:
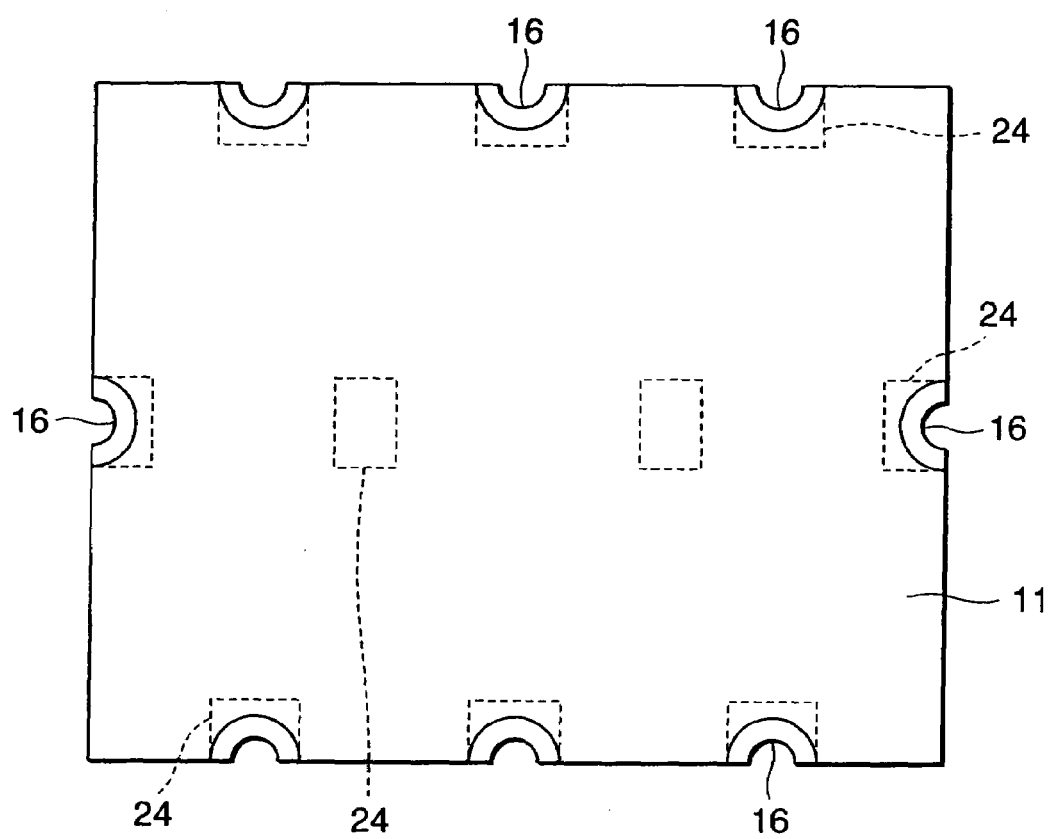
FIG. 7 is an explanatory view showing a positional relationship between electrode portions formed on the mounting substrate in FIG. 6 and side vias of the frequency divider mounted on the mounting substrate.
Figure 8:
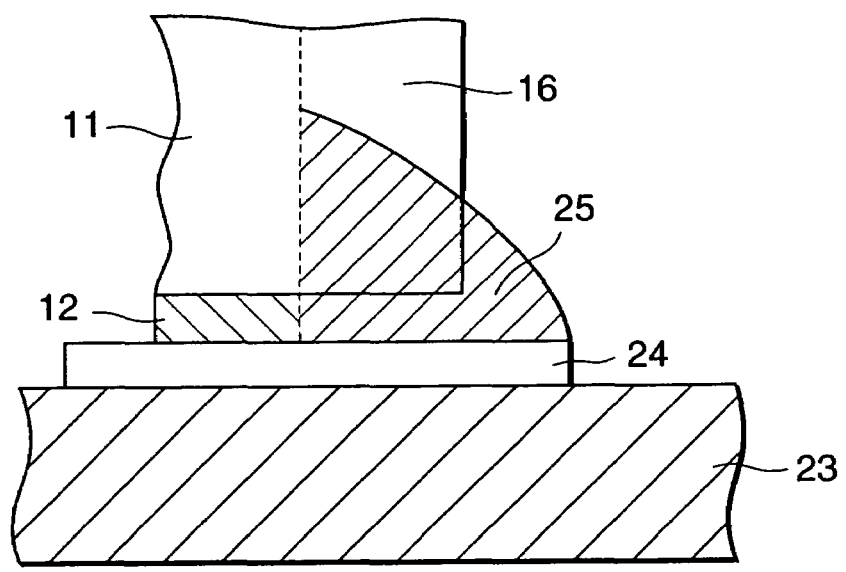
FIG. 8 is an explanatory view showing a soldering fillet applied on the side via when the electrode portion of the mounting substrate is present on the outside of a device mounting area.
Figure 9:
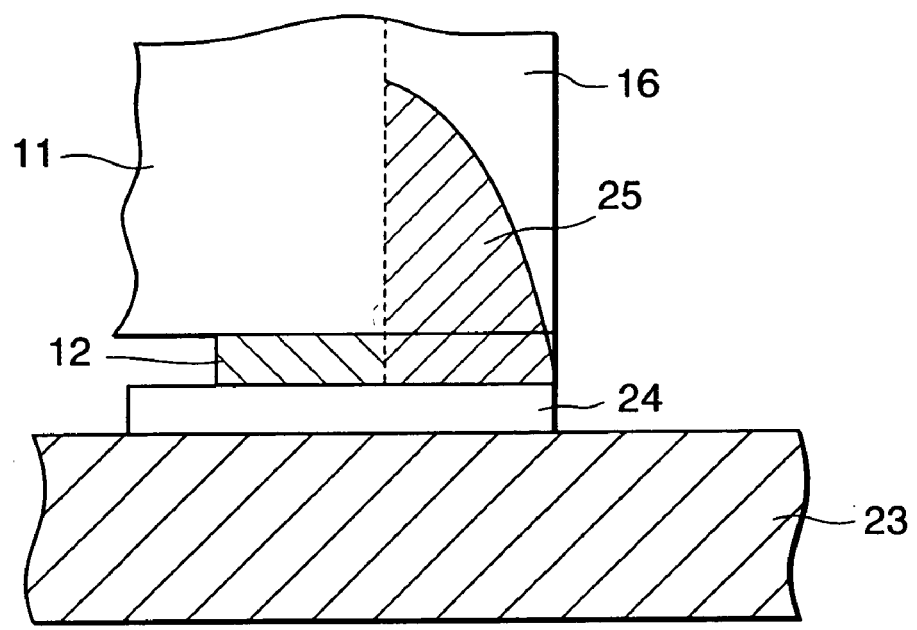
FIG. 9 is an explanatory view showing a soldering fillet applied on the side via when the electrode portion of the mounting substrate is present on the outermost side of the device mounting area.
Figure 10:
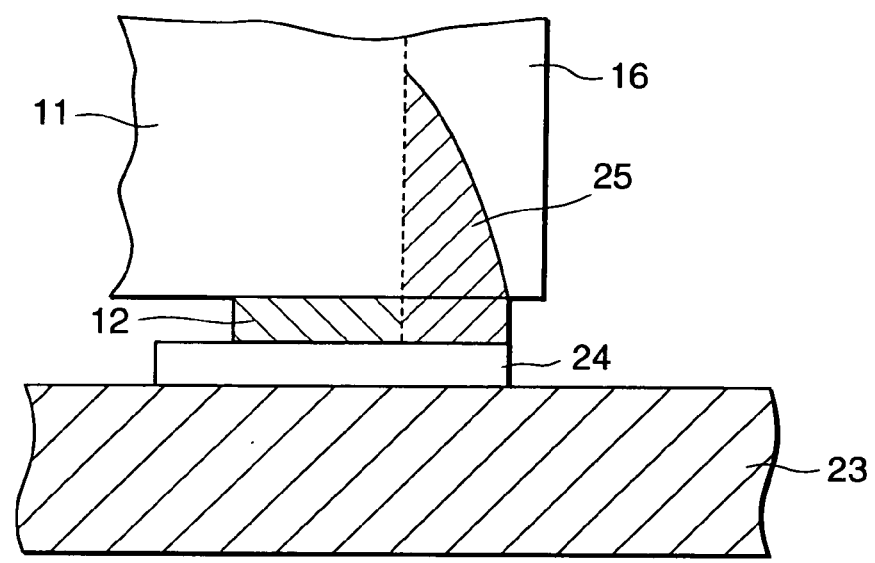
FIG. 10 is an explanatory view showing a soldering fillet applied on the side via when the electrode portion of the mounting substrate is present on the inside of the device mounting area.
Figure 11:
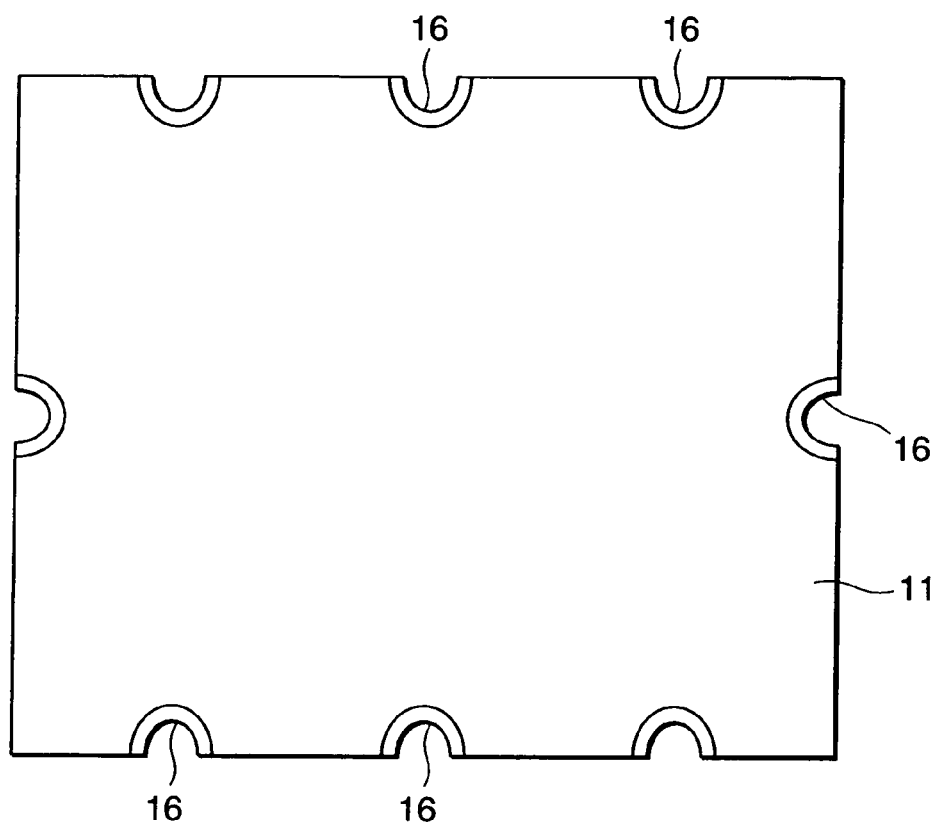
FIG. 11 is an explanatory view showing side vias of a frequency divider according to a second embodiment of the present invention.
Figure 12:
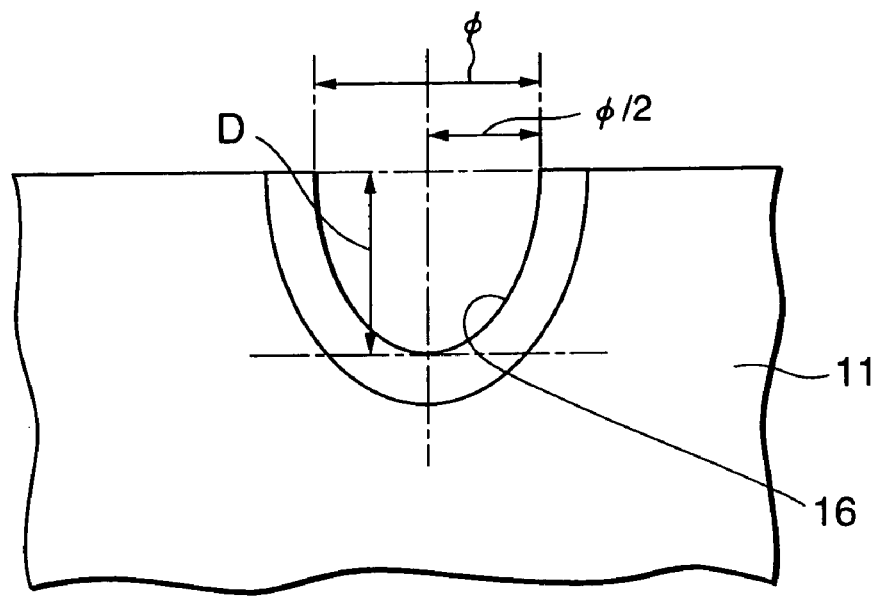
FIG. 12 is an explanatory view showing the side via in FIG. 11 in an enlarged manner.
Figure 13:
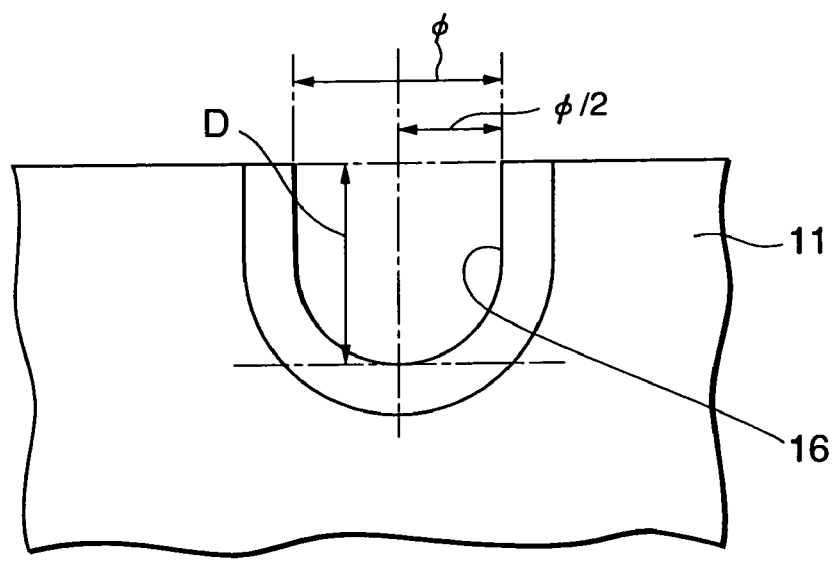
FIG. 13 is an explanatory view showing side vias of a frequency divider according to a third embodiment of the present invention in an enlarged manner.

FIG. 1 is a block diagram showing a configuration of a frequency divider according to a fist embodiment of the present invention, FIG. 2 is a characteristic diagram of the frequency divider in FIG. 1, FIG. 3 is a section view showing a package of the frequency divider in FIG. 1, FIG. 4 is a schematic diagram showing a circuit of a surface acoustic wave device which is a component of the frequency divider in FIG. 1, FIG. 5 is a plan view showing a circuit layout on the periphery of resonators in the surface acoustic wave device in FIG. 4, FIG. 6 is a plan view showing part of a mounting substrate on which the frequency divider in FIG. 1 is mounted, FIG. 7 is an explanatory view showing a positional relationship between electrode portions formed on the mounting substrate in FIG. 6 and side vias of the frequency divider mounted on the mounting substrate, FIG. 8 is an explanatory view showing a soldering fillet applied on the side via when the electrode portion of the mounting substrate is present on the outside of a device mounting area, FIG. 9 is an explanatory view showing a soldering fillet applied on the side via when the electrode portion of the mounting substrate is present on the outermost side of the device mounting area, FIG. 10 is an explanatory view showing a soldering fillet applied on the side via when the electrode portion of the mounting substrate is present on the inside of the device mounting area, FIG. 11 is an explanatory view showing side vias of a frequency divider according to a second embodiment of the present invention, FIG. 12 is an explanatory view showing the side via in FIG. 11 in an enlarged manner, and FIG. 13 is an explanatory view showing a side via of a frequency divider according to a third embodiment of the present invention in an enlarged manner. In FIGS. 7 and 11, only the side vias of the frequency divider are illustrated, and other wirings, electrodes, and the like are omitted.

In the frequency divider which is the surface acoustic wave apparatus (integrated circuit apparatus) shown in FIG. 1, two surface acoustic wave devices (integrated circuit devices) $F_1$ and $F_2$ have mutually different bandpass center frequencies $f_1$ and $f_2$, respectively, as shown in FIG. 2. In order to configure the frequency divider with such surface acoustic wave devices $F_1$ and $F_2$, phase adjusting circuits $P_1$ and $P_2$ for eliminating interference of filter characteristics of the respective surface acoustic wave devices $F_1$ and $F_2$ are provided.

The phase adjusting circuits $P_1$ and $P_2$ are connected to common terminals $T_1$ and $T_2$, respectively, and further the surface acoustic wave devices $F_1$ and $F_2$ are connected to the phase adjusting circuits $P_1$ and $P_2$, respectively. Further, input/output terminals $S_1$ and $S_2$ of frequency-divided signals are connected to the surface acoustic wave devices $F_1$ and $F_2$, respectively.

In such a frequency divider 10, as shown in FIG. 3, a device mounting layer 11a on which the two surface acoustic wave devices $F_1$ and $F_2$ described above are mounted is positioned at the uppermost layer, a ground layer 11b in which ground electrodes are formed, a circuit forming layer 11c in which high frequency circuits such as the phase adjusting circuits $P_1$ and $P_2$ are formed, and a substrate connecting layer 11d in which external connecting electrodes 12 are formed are positioned toward the lower layers from the device mounting layer 11a, and they are connected with each other to form a package substrate 11 which forms a laminate structure. Such a package substrate 11 is made of ceramics or resin.

The surface acoustic wave devices $F_1$ and $F_2$ are each configured in which a predetermined conductive pattern is formed on a piezoelectric substrate (device substrate). The piezoelectric substrate is made of piezoelectric monocrystal such as $LiNbO_3$, $LiTaO_3$, or crystalline quartz, or piezoelectric ceramics such as lead zirconate titanate based piezoelectric ceramics. But there may be employed a piezoelectric substrate in which a piezoelectric thin film such as ZnO thin film is formed on an insulating substrate. The surface acoustic wave devices $F_1$ and $F_2$ are airtightly sealed by a cap 13 so that it is protected from dust, mechanical impact, and the like.

In a mounting substrate 23 on which such a frequency divider 10 is mounted, a plurality of electrode portions 24 corresponding to the external connecting electrodes 12 are formed. The external connecting electrodes 12 and the electrode portions 24 are electrically and mechanically connected so that the frequency divider 10 is fixed on the mounting substrate 23 to 15 configure a substrate unit. In the present embodiment, the package substrate 11 has four layers, but may have one layer or a plurality of layers other than four layers. Further, when illustrated, the surface acoustic wave devices $F_1$ and $F_2$ are electrically connected to the package substrate 11 through projecting electrodes 14, but may be connected through wires.

Here, respective interlayers of the package substrate 11 are appropriately connected in an electric manner via throughholes 15 formed in a penetrating manner, side vias 16 formed in a caved manner in the thickness direction on the side surfaces, and the like, and wirings 17 such as microstrip lines are formed on the layer surface. As shown in FIG. 4, resonators 18 resonating with surface acoustic waves of a predetermined frequency are formed on the piezoelectric substrate of the surface acoustic wave device $F_1$, $F_2$. An input electrode 19 which electrically connects the resonators 18 and the package 11 and to/from which electric signals for the resonators 18 are input/output, an output electrode 20, and a ground electrode 21 are electrically connected to the resonators 18 via the wirings 17.

As shown in FIG. 5, the resonator 18 is configured in teeth shape of a pair of combs which is meshing each other. When voltage is applied to the resonator 18 at the input side to generate an electric field, a surface acoustic wave is generated on the piezoelectric substrate by a piezoelectric effect. Further, a mechanical distortion due to the thus generated surface acoustic wave generates an electric field, which is converted to an electric signal in the resonator 18 at the output side. Reflectors 22 for reflecting surface acoustic waves are arranged on both sides of the resonator 18.

Additionally, when illustrated, the wirings 17 between the input electrode 19 and the output electrode 20 are serial arm, and parallel arms which are a plurality of wirings 17 between the serial arm and the ground electrodes 21 are configured so that a ladder type circuit in which the resonators 18 are arranged in the serial arm and parallel arm manner, but the surface acoustic wave devices $F_1$ and $F_2$ may employ other than such a circuit configuration.

As shown in FIG. 6, electrode portions 24 formed on the mounting substrate 23 on which the frequency divider 10 is mounted are all arranged on the inside of a device mounting area A which is a mounting area of the frequency divider 10. The inside of the device mounting area in this specification means the concept including border portions between the device mounting area A and other areas. Therefore, the electrode portions 24 may be formed in contact with the border portions, and formed inside without being contacted with the border portions. As long as the electrode portions 24 are arranged on the inside of the device mounting area A, the layout pattern thereof can be freely set.

Since the electrode portions 24 are formed on the inside of the device mounting area A, the electrode portion 24 corresponding to the frequency divider 10 is not present on the outside of the package substrate 11 of the frequency divider 10 mounted on the device mounting area A of the mounting substrate 23 as shown in FIG. 7.

Here, when the electrode portion 24 is present on the outside of the device mounting area A, a soldering fillet applied on a side via is shown in FIG. 8. Since the soldering fillet 25 is spread from the lower portion of the side via 16 to the whole exposed surface of the electrode portion 24 or it is expanded out of the electrode portion 24 in a protruded manner when the applied amount is large, the soldering fillet 25 is protruded outward when illustrated in FIG. 8. As a result, the mounting area of the frequency divider 10 becomes larger due to such a soldering fillet 25 so that the high density mounting cannot be conducted.

On the contrary, when the electrode portions 24 are arranged on the inside of the device mounting area A as in the present embodiment, the cases shown in FIGS. 9 and 10 are taken. In other words, when the electrode portion 24 of the mounting substrate 23 is present on the outermost side of the device mounting area A, (FIG. 9), and the electrode portion 24 of the mounting substrate 23 is present on the inside of the device mounting area A (FIG. 10), the soldering fillet 25 applied on the side via 16 is similarly spread over the whole exposed surface of the electrode portion 24, but the electrode portion 24 itself is arranged on the inside of the device mounting area A so that the soldering fillet 25 is not also protruded from the device mounting area A. As described above, since the protrusion of the soldering fillet 25 applied on the side via 16 is prevented, the mounting area of the frequency divider 10 can be made small to the outer size of the package substrate 11, there by performing the high density mounting.

Here, as shown in FIGS. 12 and 13, when the side via 16 formed on the package substrate 11 of the frequency divider 10 is assumed to have the opening width $\phi$ and the maximum depth D, $\phi/2<D$ is assumed. Further, the shape along the substrate surface of the package substrate 11 in the side via 16 may have a shape forming part of an oval as shown in FIG. 12, or a shape forming part of an ellipse as shown in FIG. 13. Additionally, as long as the condition of $\phi/2<D$ is satisfied, the shape is not particularly limited, and may be, for example, triangle, quadrangle, or the like.

As described above, since the side via 16 is made to the size of $\phi/2<D$ so that the soldering fillet 25 applied on the side via 16 is within the side via 16 and the protrusion thereof can be prevented, the mounting area of the frequency divider 10 can be made small to the outer size of the package substrate 11 so that the high density mounting can be performed. Additionally, the technique for arranging the electrode portions 24 of the mounting substrate 23 on the inside of the device mounting area A and the technique for making the side vias 16 to the size of $\phi/2<D$ can be independently used, and both used.

In the above description, the example in which the present invention is applied to the frequency divider 10 is shown, but the present invention is not limited to the frequency divider 10, and can be applied to various surface acoustic wave apparatuses on which one or a plurality of surface acoustic wave devices are mounted. Further, the present invention is not limited to such surface acoustic wave apparatuses, can be applied to various integrated circuit apparatuses in which integrate circuit devices where predetermined circuit patterns are formed on a device substrate such as a piezoelectric substrate or a silicon substrate is mounted on a package substrate.

As can be seen from the above description, it is possible to obtain the following effects according to the present invention. Since the electrode portions are arranged on the inside of the device mounting area, it is possible to prevent the protrusion of the soldering fillet applied on the side via. Further, since the soldering fillet applied on the side via is within the side via, it is possible to prevent the protrusion of the soldering fillet applied on the side via. As described above, since it is possible to prevent the protrusion of the soldering fillet applied on the side via, the mounting area of the integrated circuit apparatus can be made small to the outer size of the package substrate so that the high density mounting can be performed.

Figure 14:
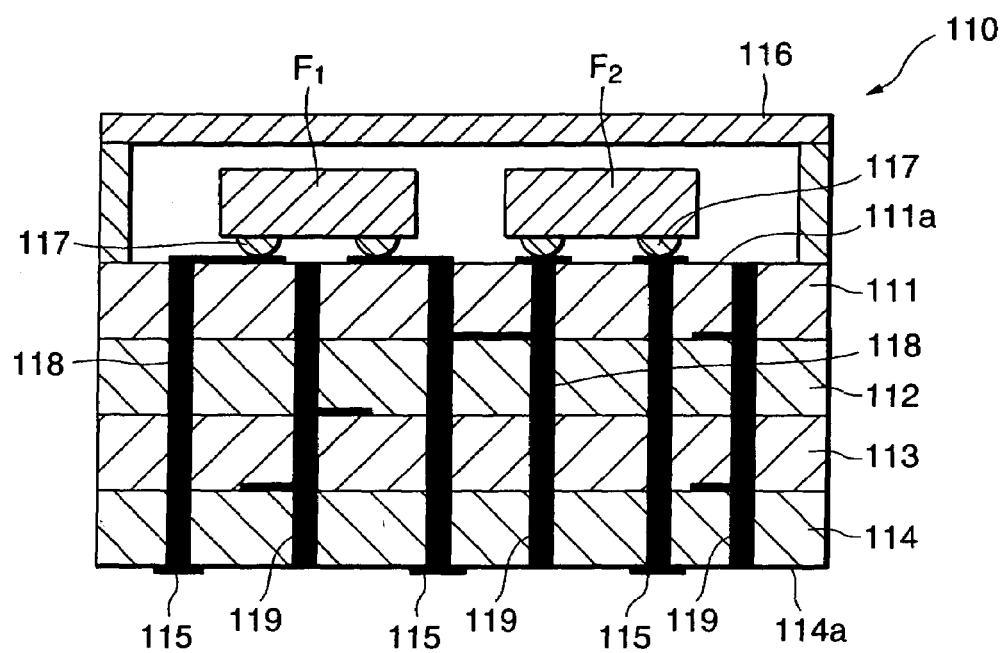
FIG. 14 is a section view showing a package of a frequency divider according to a fourth embodiment of the present invention.

FIG. 14 is a section view showing a frequency divider according to a fourth embodiment of the present invention. In the package 110 of the frequency divider, a device mounting layer 111 in which the two surface acoustic wave devices $F_1$ and $F_2$ described above are mounted on a device mounting surface 111a is positioned at the uppermost layer, a ground layer (function layer) 112 in which ground electrodes are formed, a circuit forming layer (function layer) 113 in which high frequency circuits such as the phase adjusting circuits $P_1$ and $P_2$ are formed, and the lowermost layer which is a substrate connecting layer 114 in which common ground electrodes or external connecting terminals 115 are formed are positioned toward the lower layers from the device mounting layer 111, and they are connected with each other to form a laminate structure.

These layers 111 to 114 are all made of resin. As illustrated, in the substrate connecting layer 114, a terminal forming surface 114a in which the external connecting terminals 115 electrically connected to the mounting substrate are formed faces in the opposite direction to the device mounting surface 111a of the device mounting layer 111. The surface acoustic wave devices $F_1$ and $F_2$ are airtightly sealed by a cap 116 to be entirely packaged.

In the present embodiment, the function layer is configured with the two layers of the ground layer 112 and the circuit forming layer 113, but may be configured with one layer or three or more layers, and wirings or the predetermined circuit patterns can be formed in the layer if necessary. Further, when illustrated, the surface acoustic wave devices $F_1$ and $F_2$ are electrically connected to the device mounting layer though bumps 117, but may be connected through wires.

Here, since the layers 111 to 114 are made of resin, the respective interlayers are appropriately connected via throughholes 118 in an electric manner. The throughholes 118 are formed from the device mounting layer 111 through the ground layer 112 and the circuit forming layer 113 to the substrate connecting layer 114 in a penetrating manner, and have conductive members injected therein. In such throughholes 118, some electrically connect between the device mounting surface 111a side and the terminal forming surface 114a side, and others electrically connect other portions than the above portion (when illustrated, between the ground layer 112 and the circuit forming layer 113, between the device mounting layer 111 and the ground layer 112, and between the ground layer 112 and the opposite surface of the terminal forming surface 114a of the substrate connecting layer 114).

Here, the latter throughholes 118 penetrate the substrate connecting layer 114 which is the lowermost layer or the device mounting layer 111 which is the uppermost layer, but wirings are not extended therefrom and open stubs 119 are formed. In the frequency divider, in consideration of variation of the frequency characteristics by the open stubs 119, that is such open stubs 119, line width, line length, and the like are set so as to obtain predetermined electric frequency characteristics.

The package (surface acoustic wave apparatus) 110 of the frequency divider according to the present embodiment is manufactured in the following manner. At first, copper foil is applied on the substrate materials made of resin forming the respective layers 111 to 114, and etching is performed to form predetermined circuit patterns or wiring patterns. Then these are aligned with each other to be adhered, and a package with a laminate structure is formed.

Next, the throughholes 118 are formed and injected with a conductive member such as copper, and the surface acoustic wave devices $F_1$ and $F_2$ are mounted on the device mounting layer 111 by ultrasonic wave. The throughholes 118 may be injected with an insulating member. Finally, the surface acoustic wave devices $F_1$ and $F_2$ are airtightly sealed using the cap 116.

According to the package 110 of the frequency divider described above, since the predetermined electric frequency characteristics can be obtained in consideration of the open stubs 119, it is possible to prevent that the number of laminates is increased in order to avoid the open stubs 119 and the package becomes larger in size. Therefore, it is possible to obtain the package 110 of the thin frequency divider having the predetermined electric frequency characteristics. Further, since the presence of the open stubs 119 can be allowed, it is possible to configure the package 110 of the frequency divider whose layer material employs resin which cannot form via holes connecting only the required interlayers, thereby achieving cost reduction.

In the above description, the example in which the present invention is applied to the package 110 of the frequency divider is shown, but the present invention is not limited to the package 110 of the frequency divider, and can be applied to surface acoustic wave apparatuses such as various surface acoustic wave filtering apparatuses on which surface acoustic wave filtering devices, that is one or a plurality of surface acoustic wave devices are mounted. Therefore, the scope of application of the present invention is not limited to a filter, and can be applied to various fields other than filter.

As can be seen from the above description, it is possible to obtain the following effects according to the present invention. Since there is configured such that the predetermined electric frequency characteristics can be obtained in consideration of the open stubs, it is possible to prevent that the number of laminates is increased in order to avoid the open stubs and the package becomes larger in size. Therefore, it is possible to obtain a thin surface acoustic wave apparatus having the predetermined electric frequency characteristics. Since the presence of the open stubs can be allowed, it is possible to configure the surface acoustic wave apparatus whose layer material employs resin which cannot form via holes connecting only the required interlayers, thereby achieving cost reduction.

Figure 15:
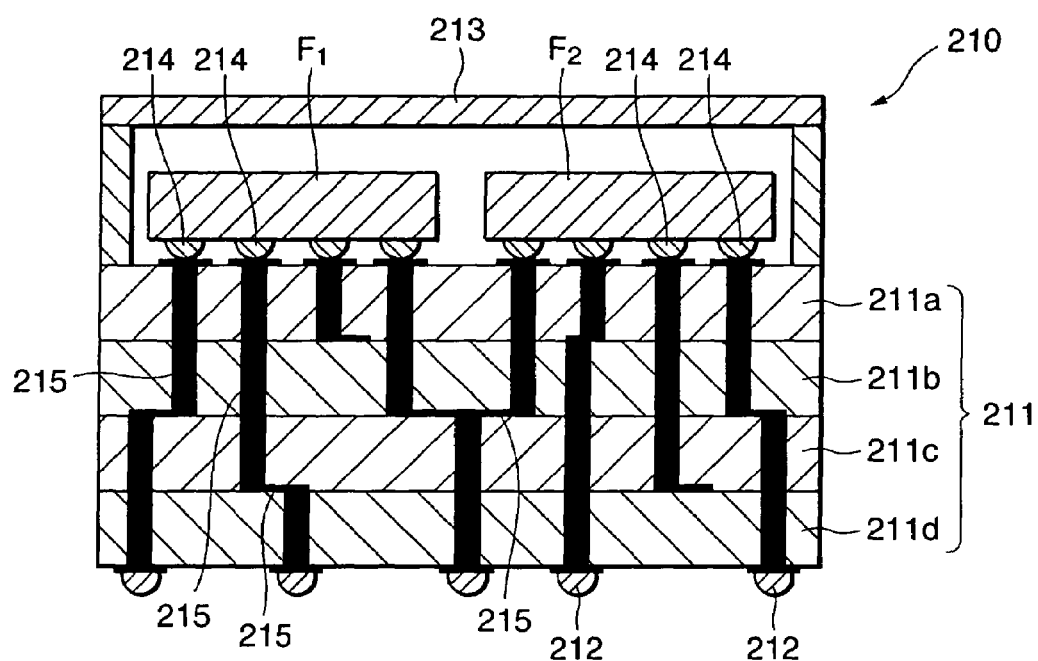
FIG. 15 is a section view showing a package of a frequency divider according to a fifth embodiment of the present invention.

FIG. 15 is a section view showing a frequency divider according to a fifth embodiment of the present invention. In a package (surface acoustic wave apparatus) 210 of this frequency divider, a device mounting layer 211a on which the two surface acoustic wave devices $F_1$ and $F_2$ described above are mounted is positioned at the uppermost layer, a ground layer 211b in which ground electrodes are formed, a circuit forming layer 211c in which high frequency circuits such as the phase adjusting circuits $P_1$ and $P_2$ are formed, and a substrate connecting layer 211d in which common ground electrodes or external connecting terminals 212 are formed are positioned toward the lower layers from the device mounting layer 211a, and they are connected with each other to form a package substrate 211 forming a laminate structure.

The package substrate 211 is made of ceramics or resin. The surface acoustic wave devices $F_1$ and $F_2$ are airtightly sealed by a cap 213 to be entirely packaged. In the present embodiment, the package substrate 211 has four layers, but may have one layer or a plurality of layers other than four layers. Here, the respective interlayers of the package substrate 211 are appropriately connected by throughholes, via holes, or wirings 215 such as sidewall wirings formed on the side surfaces in an electric manner, and the wirings 215 such as microstrip lines are formed on the layer surface.

Figure 16:
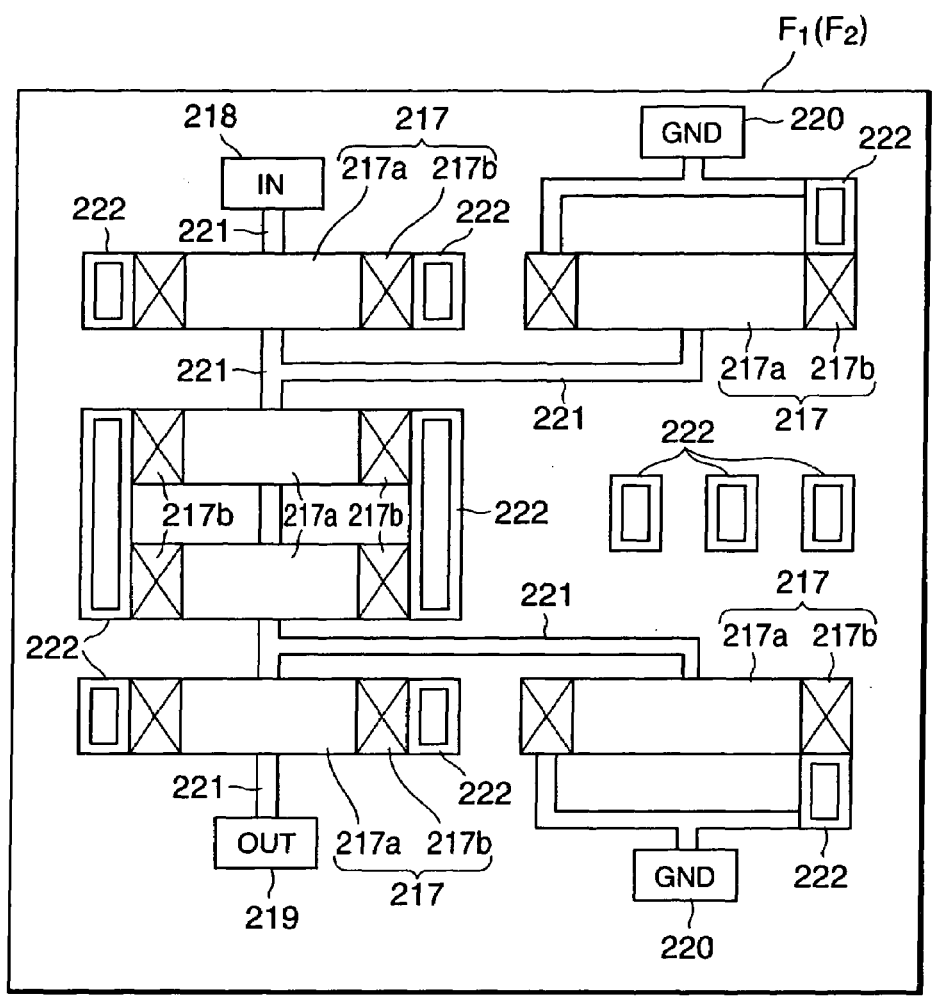
FIG. 16 is a block diagram showing a configuration of a surface acoustic wave device which is a component of a package of a frequency divider according to a sixth embodiment of the present invention.
Figure 17:
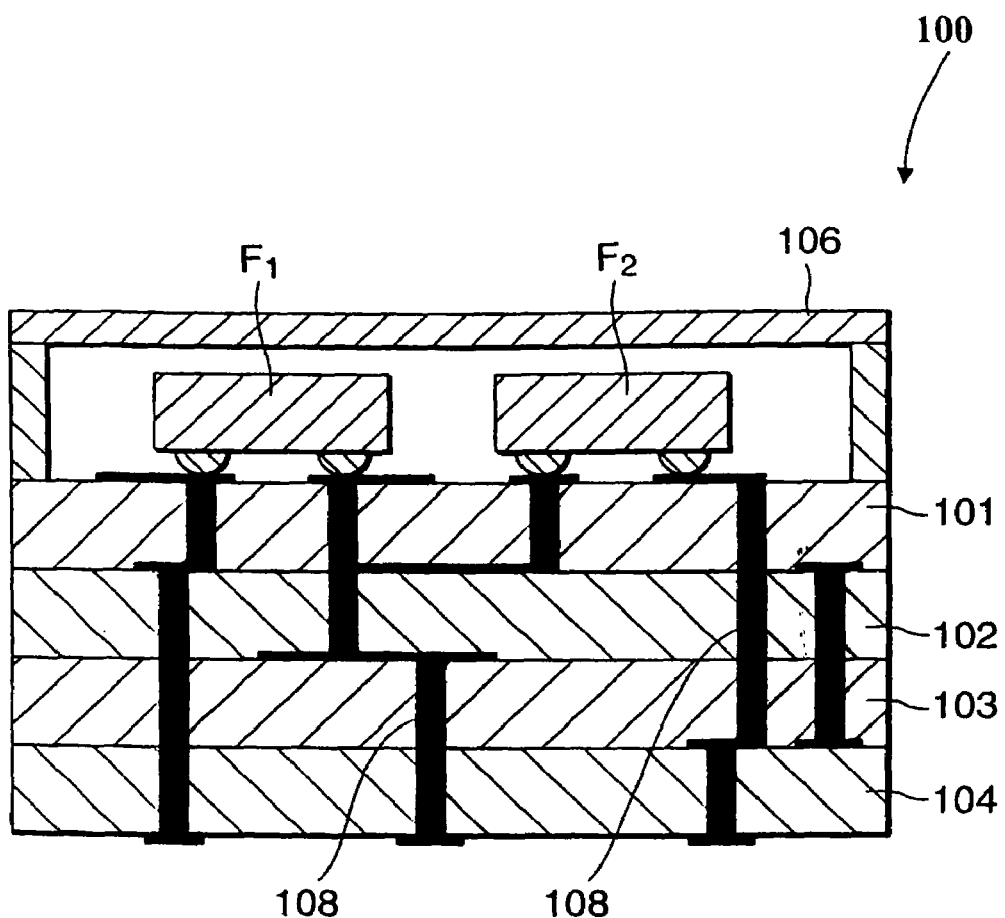
FIG. 17 is a section view showing a package of a conventional frequency divider.

As shown in FIG. 16, the surface acoustic wave devices $F_1$ and $F_2$ which are components of the package 210 of the frequency divider each comprise resonators 217 resonating with surface acoustic waves of a predetermined frequency. An input electrode (first electrode) 218 which electrically connects the resonators 217 and the package substrate 211 and is concerned with the electric operation of the resonator 217, an output electrode (first electrode) 219, and a ground electrode (first electrode) 220 are connected to the resonators 217 via wirings 221.

Further, radiating electrodes (second electrodes) 222 which are electrically connected to the wirings other than the input/output electrodes formed in the package substrate 211 and which are not concerned with the electric operation of the resonators 217, that is dummy electrodes are formed. Here, the wirings other than the input/output electrodes specifically means wirings connected with the ground electrodes of the package substrate 211, or wirings which are merely laid and whose potentials are inconstant. Additionally, the electrodes 218, 219, 220, 222, and the package substrate 211 are bump-connected by ultrasonic wave where the electrodes 218, 219, 220, 222 are set to be projecting electrodes 214.

Here, the resonators 217 are each configured with an electrode 217a in a crossing-fingers shape (teeth shape of a comb) for converting the surface acoustic waves to electric signals, and a reflector 217b for reflecting the surface acoustic waves. Some radiating electrodes 222 are directly, or electrically connected via the wirings 221 to the reflectors 217b. Further, other radiating electrodes 222 are provided independent of the resonators 217 and the electrodes 218, 219, and 220.

As described above, since the radiating electrodes 222 are not concerned with the electric operation of the resonators 217, even when the radiating electrodes 222 and the resonators 217 are electrically connected, an electric signal is not flowed to the radiating electrodes 222. Further, the radiating electrodes 222 may be in the form of being electrically connected to the reflectors 217b, or in the form of being provided independent of the resonators 217 and the electrodes 218, 219, and 220.

The package 210 of the frequency divider according to the present embodiment is manufactured in the following manner. As first, predetermined circuit patterns or wiring patterns are formed on the substrate materials structuring the respective layers 211a to 211d by using the thin film forming technique. Then these are aligned with each other to be adhered, and a package with a laminate structure is configured. Next, the surface acoustic wave devices $F_1$ and $F_2$ are mounted on the device mounting layer 211a by ultrasonic wave, and the surface acoustic wave devices $F_1$ and $F_2$ are airtightly sealed using the cap 213.

According to the aforementioned package 210 of the frequency divider, as described above, the radiating electrodes 222 which are electrically connected with the wirings other than the input/output electrodes formed on the package substrate 211 and which are not concerned with the electric operation of the resonators 217 are formed in the surface acoustic wave devices $F_1$ and $F_2$. Therefore, heat generated during device operating is propagated though the radiating electrodes 222 to the wirings of the package substrate 211 so that radiating is conducted. Thereby, it is possible to efficiently conduct radiating of the surface acoustic wave devices $F_1$ and $F_2$ without increasing the package in size. Particularly, when the radiating electrodes 222 are electrically connected with the reflectors 217b, it is possible to efficiently conduct radiating of the reflectors 217b whose temperature becomes higher during operating of the surface acoustic wave devices $F_1$ and $F_2$.

In the above description, the example in which the present invention is applied to the package 210 of the frequency divider is shown, but the present invention is not limited to the package 210 of the frequency divider, and can be applied to surface acoustic wave apparatuses such as various surface acoustic wave filtering apparatuses on which surface acoustic wave filtering devices, that is one or a plurality of surface acoustic wave devices are mounted. Therefore, the scope of application of the present invention is not limited to a filter, and can be applied to various fields other than filter.

As can be seen from the above description, it is possible to obtain the following effects according to the present invention. Since second electrodes which are electrically connected to the wirings formed on the package substrate into which input/output signals are not flowed and which are not concerned with the electric operation of the resonators are formed on the surface acoustic wave devices, heat generated during device operating is propagated through the second electrodes to the wirings of the package substrate so that it is possible to efficiently conduct radiating of the surface acoustic wave devices without increasing the package in size. Particularly, when the radiating electrodes and the reflectors are electrically connected, it is possible to efficiently conduct radiating of the reflectors whose temperature becomes maximum during operating of the surface acoustic wave devices.

What is claimed is:

1. A surface acoustic wave device mounted on a package substrate, comprising:
   a dummy electrode which is connected to wiring other than input/output electrodes formed on the package substrate and comprises an electrode other than a ground electrode, and propagates heat generated in the surface acoustic wave device to conduct heat; and
   a resonator directly connected to said dummy electrode, wherein said dummy electrode does not conduct electricity via said connection to said wiring, and wherein said dummy electrode is formed on a same surface of the surface acoustic wave device as circuit elements which are formed on the surface acoustic wave device.

2. The device mounted on a package substrate of claim 1, further comprising a pound electrode connected to said surface acoustic wave device.

3. The device of claim 1, wherein said dummy electrode is for conducting heat.

4. A surface acoustic wave apparatus comprising surface acoustic wave devices having a predetermined bandpass center frequency and a package substrate in which the surface acoustic wave devices are mounted in a flip-chip mounting manner,
   wherein the surface acoustic wave devices each comprise:
      resonators for resonating with surface acoustic waves of a predetermined frequency;
      first electrodes which electrically connect the resonators and the package substrate, and are concerned with electric operation of the resonators; and
      dummy electrodes which are connected to wirings other than the input/output electrodes formed on the package substrate and comprise electrodes other than ground electrodes, wherein said dummy electrodes do not conduct electricity via said connections to said wirings, wherein said dummy electrodes are formed on a same surface of the surface acoustic wave device as at least one of said resonators and said first electrodes, wherein at least one of said dummy electrodes is directly connected to at least one of said resonators.

5. A surface acoustic wave apparatus according to claim 4, wherein two surface acoustic wave devices having mutually different bandpass center frequencies are mounted on said package substrate.

6. A surface acoustic wave apparatus according to claim 5, wherein the second electrodes comprise projecting electrodes.

7. A surface acoustic wave apparatus according to claim 4, wherein the dummy electrodes comprise projecting electrodes.

8. A surface acoustic wave apparatus according to claim 4, wherein the dummy electrodes are connected to reflectors provided in the resonators for reflecting surface acoustic waves.

9. A surface acoustic wave apparatus according to claim 4, wherein at least one other of the dummy electrodes are provided independent of the resonators and the first electrodes.

10. The device mounted on a package substrate of claim 4, wherein said resonator comprises a reflector.

11. The device mounted on a package substrate of claim 10, wherein said dummy electrode is connected to said reflector.

12. The apparatus of claim 4, further comprising a ground electrode.

13. The apparatus of claim 4, wherein said dummy electrodes are for conducting heat.

14. A device comprising:
   a package substrate; and
   a circuit mounted on said package substrate,
   wherein said circuit comprises:
      a resonator;
      an input/output electrode connected to an input/output of said resonator via a first wiring;
      a ground electrode connected to said resonator via a second wiring; and
      a dummy electrode connected to a third wiring other than said first and second wirings, wherein said dummy electrode has a function other than the ground electrode, wherein said dummy electrode does not conduct electricity via said connections to said third wiring, and wherein said dummy electrode is formed at a same surface of the circuit as said input/output of said circuit, wherein said dummy electrode is directly connected to said resonator.

15. The device of claim 14, wherein said third wiring has an inconstant potential.

16. The device of claim 14, wherein said resonator comprises a reflector.

17. The device of claim 14, wherein said dummy electrode is for conducting heat.

* * * * *